US007460675B2

(12) United States Patent
L'Espérance et al.

(10) Patent No.: US 7,460,675 B2
(45) Date of Patent: Dec. 2, 2008

(54) AUTO-ADJUSTING SOUND MASKING SYSTEM AND METHOD

(75) Inventors: André L'Espérance, Sillery (CA); Alex Boudreau, Sherbrooke (CA)

(73) Assignee: Soft DB Inc., Quebec (CA)

( * ) Notice: Subject to any disclaimer, the term of this patent is extended or adjusted under 35 U.S.C. 154(b) by 931 days.

(21) Appl. No.: 10/873,831

(22) Filed: Jun. 22, 2004

(65) Prior Publication Data

US 2006/0009969 A1 Jan. 12, 2006

(30) Foreign Application Priority Data

Jun. 21, 2004 (CA) .................................... 2471674

(51) Int. Cl.
*H04R 3/02* (2006.01)
*H03G 3/20* (2006.01)

(52) U.S. Cl. ........................................ 381/73.1; 381/57

(58) Field of Classification Search ................ 381/73.1, 381/57, 61, 66, 71.3, 71.8; 704/226
See application file for complete search history.

(56) References Cited

U.S. PATENT DOCUMENTS

| | | | | |
|---|---|---|---|---|
| 3,567,863 | A | | 3/1971 | Morrissey |
| 3,879,578 | A | | 4/1975 | Wildi |
| 3,985,200 | A | | 10/1976 | Sepmeyer |
| 3,985,957 | A | | 10/1976 | Torn |
| 4,010,324 | A | | 3/1977 | Jarvis et al. |
| 4,052,564 | A | | 10/1977 | Propst et al. |
| 4,052,720 | A | * | 10/1977 | McGregor et al. .......... 340/522 |
| 4,054,751 | A | | 10/1977 | Calder et al. |
| 4,059,726 | A | | 11/1977 | Watters et al. |
| 4,098,370 | A | | 7/1978 | McGregor et al. |
| 4,214,298 | A | | 7/1980 | Propst et al. |
| 4,319,088 | A | | 3/1982 | Orfield |
| 4,438,526 | A | | 3/1984 | Thomalla |
| 4,476,572 | A | | 10/1984 | Horrall et al. |
| 4,674,124 | A | | 6/1987 | Horrall et al. |
| 4,682,670 | A | | 7/1987 | Lerner et al. |
| 4,686,693 | A | | 8/1987 | Ritter |
| 4,761,921 | A | | 8/1988 | Nelson |
| 5,131,047 | A | * | 7/1992 | Hashimoto et al. ....... 381/71.11 |
| 5,192,342 | A | | 3/1993 | Baron et al. |
| 5,327,496 | A | * | 7/1994 | Russell et al. ............. 381/71.8 |

(Continued)

FOREIGN PATENT DOCUMENTS

| | | |
|---|---|---|
| CA | 1042811 | 11/1978 |

(Continued)

OTHER PUBLICATIONS

J.S. Bradley; The Acoustical Design of Conventional Open Plan Offices; Institute for Research in Constructions, National Research Council, Canadian Acoustics; vol. 27, No. 3 (2003)—23.

*Primary Examiner*—Vivian Chin
*Assistant Examiner*—Kile Blair
(74) *Attorney, Agent, or Firm*—Fulbright & Jaworski LLP

(57) ABSTRACT

A system and method for generating a masking noise level and spectrum automatically adjusted to obtain a target masking noise spectrum in a room. The system comprises a white noise generator and a mask filter automatically determined according to a correction of an acoustical response of the room and to the target masking noise corrected by an ambient noise.

15 Claims, 10 Drawing Sheets

U.S. PATENT DOCUMENTS

| | | | | |
|---|---|---|---|---|
| 5,506,910 | A | 4/1996 | Miller et al. | |
| 5,782,551 | A | 7/1998 | Capaul | |
| 5,889,869 | A | 3/1999 | Botros et al. | |
| 6,164,408 | A | 12/2000 | Lamm et al. | |
| 6,188,771 | B1 | 2/2001 | Horrall | |
| 6,282,296 | B1 * | 8/2001 | Konno et al. | 381/96 |
| 6,290,140 | B1 * | 9/2001 | Pesko et al. | 236/47 |
| 6,481,173 | B1 | 11/2002 | Roy et al. | |
| 6,594,365 | B1 * | 7/2003 | Eatwell | 381/73.1 |
| 2001/0021259 | A1 | 9/2001 | Horrall | |
| 2003/0091199 | A1 | 5/2003 | Horrall et al. | |
| 2003/0142833 | A1 * | 7/2003 | Roy et al. | 381/73.1 |
| 2003/0219133 | A1 | 11/2003 | Horrall et al. | |

FOREIGN PATENT DOCUMENTS

| | | |
|---|---|---|
| CA | 1068140 | 12/1979 |
| CA | 1154689 | 10/1983 |
| CA | 2122164 | 12/1995 |
| CA | 2398201 | 3/2003 |
| EP | 0 376 482 | 8/1995 |
| WO | WO 02/25631 | 3/2002 |
| WO | WO 03/037035 | 5/2003 |

* cited by examiner

AUTO-ADJUSTING SOUND MASKING SYSTEM AND METHOD

This application claims priority to Canadian Application No. 2,471,674 filed on Jun. 21, 2004, the contents of which arc incorporated by reference.

FIELD OF THE INVENTION

The present invention relates to sound masking systems and methods. More specifically, the present invention is concerned with an auto-adjusting sound masking system and method.

BACKGROUND OF THE INVENTION

Sound masking systems basically include a masking sound generator, an equalizer, a power amplifier and one or more loudspeakers.

As sound masking systems are being developed, it is now known that efficiency thereof is linked to their ability to emit an ideal masking noise spectrum with an adequate precision. The ideal masking noise is defined as achieving optimized speech privacy at a listener's position for example (Acoustical Design of Conventional Open Plan Offices, 2003).

A main challenge remains in adjusting this ideal spectrum to any target environment, taking into account a number of parameters including a size of the room, a coating of the walls of the room, the furniture of the room and the ambient noise for example. The masking noise is usually adjusted manually by 1 octave equalization or ⅓ octave equalization, which proves to be sufficient in cases of simple environments, for example in the case of a building with a very uniform construction with a limited number of masking loudspeakers. However, such a trial and error method is laborious and often yields poor results in the cases of larger environments. Indeed, larger masking systems may cover more than one room or workplace in a building for example, and each may need a specific masking sound level control.

U.S. Patent No. 4,438,526 to Thomalla, issued in 1984, discloses an automatic volume and frequency controlled sound masking system, wherein a masking noise is generated by a set of analog filters, and is adjusted during emission thereof, according to a noise measured by microphones. This system modifies the level and spectra of the sound masking noise generated in a room according to a background noise level in the room, by increasing the masking noise when the back ground noise increases. When there is no other noise, such as noise due to the activity of workers for example, in the room other than the background noise, the masking noise level and spectra generated by the system done according to a preset voltage. The preset voltage is adjusted manually to provide a predetermined DC output and thus a predetermined background noise level (the resulting masking noise) when the room is otherwise quiet.

In spite of these efforts, there is room in the art for an auto-adjusting sound masking system and a method allowing emitting a target masking noise.

SUMMARY OF THE INVENTION

There is provided a sound masking system emitting a target masking noise in a room, comprising a white noise generator and a mask filter, wherein the mask filter is automatically determined according to a correction of an acoustical response of the room, obtained when loudspeakers emit a white noise generated by the white noise generator, and to the target masking noise corrected by an ambient noise obtained when the loudspeakers are off; the mask filter once determined filtrating a white noise generated by the white noise generator to yield the target masking noise emitted in the room.

There is further provided a method for generating a target masking noise in a room, comprising: providing a white noise generator; selecting a target masking noise; determining a mask filter according to the selected target masking noise; and filtering a white noise generated by the white noise generator through the mask filter; whereby the step of determining a mask filter comprises obtaining an acoustical response and an ambient noise of the room and determining a target noise correction filter.

Other objects, advantages and features of the present invention will become more apparent upon reading of the following non-restrictive description of embodiments thereof, given by way of example only with reference to the accompanying drawings.

DESCRIPTION OF EMBODIMENTS OF THE INVENTION

Figure 1:
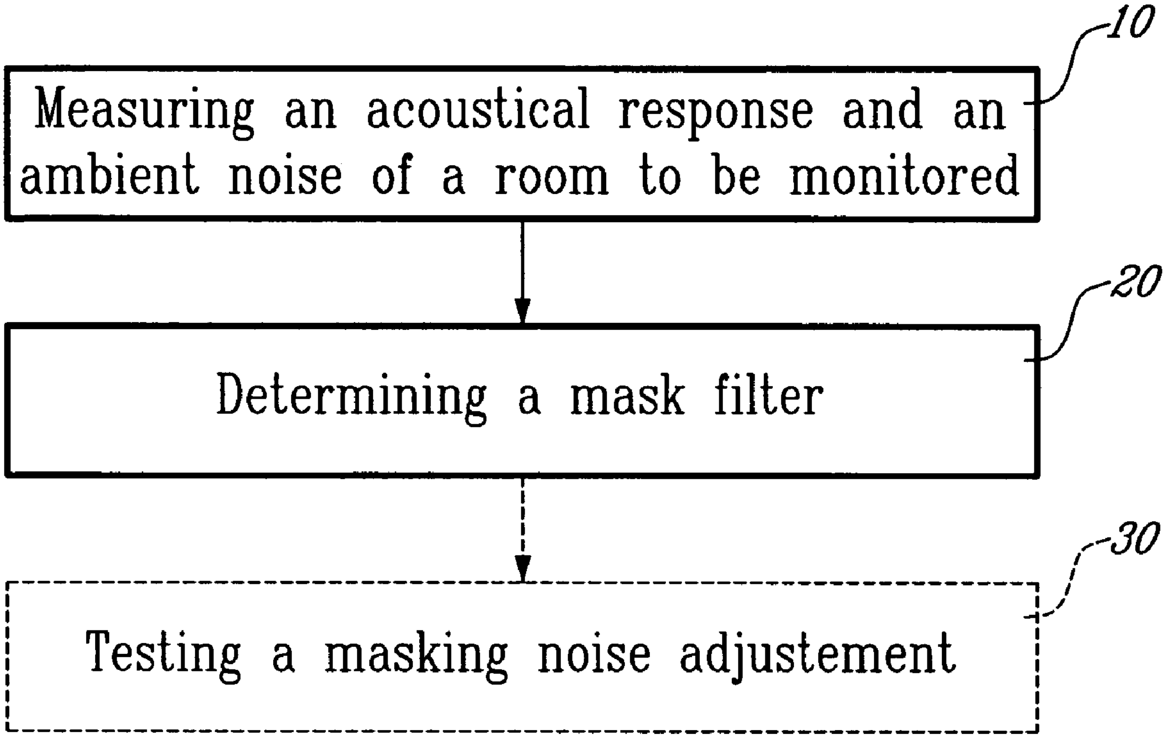
FIG. 1 is a flowchart of method according to an embodiment of a first aspect of the present invention.

As illustrated in FIG. 1 of the appended drawings, a method according to a first aspect the present invention generally comprises measuring an acoustical response and an ambient noise of a room to be monitored (step 10); and determining a mask filter (step 20). A step of testing auto-adjustment of a masking noise generated through the mask filter determined in step 20 may be further contemplated (step 30).

In step 10, the acoustical response and the ambient noise of the room to be monitored are measured so as to determine the acoustical characteristics of the room in an emission frequency band of a target masking noise.

Figure 3:
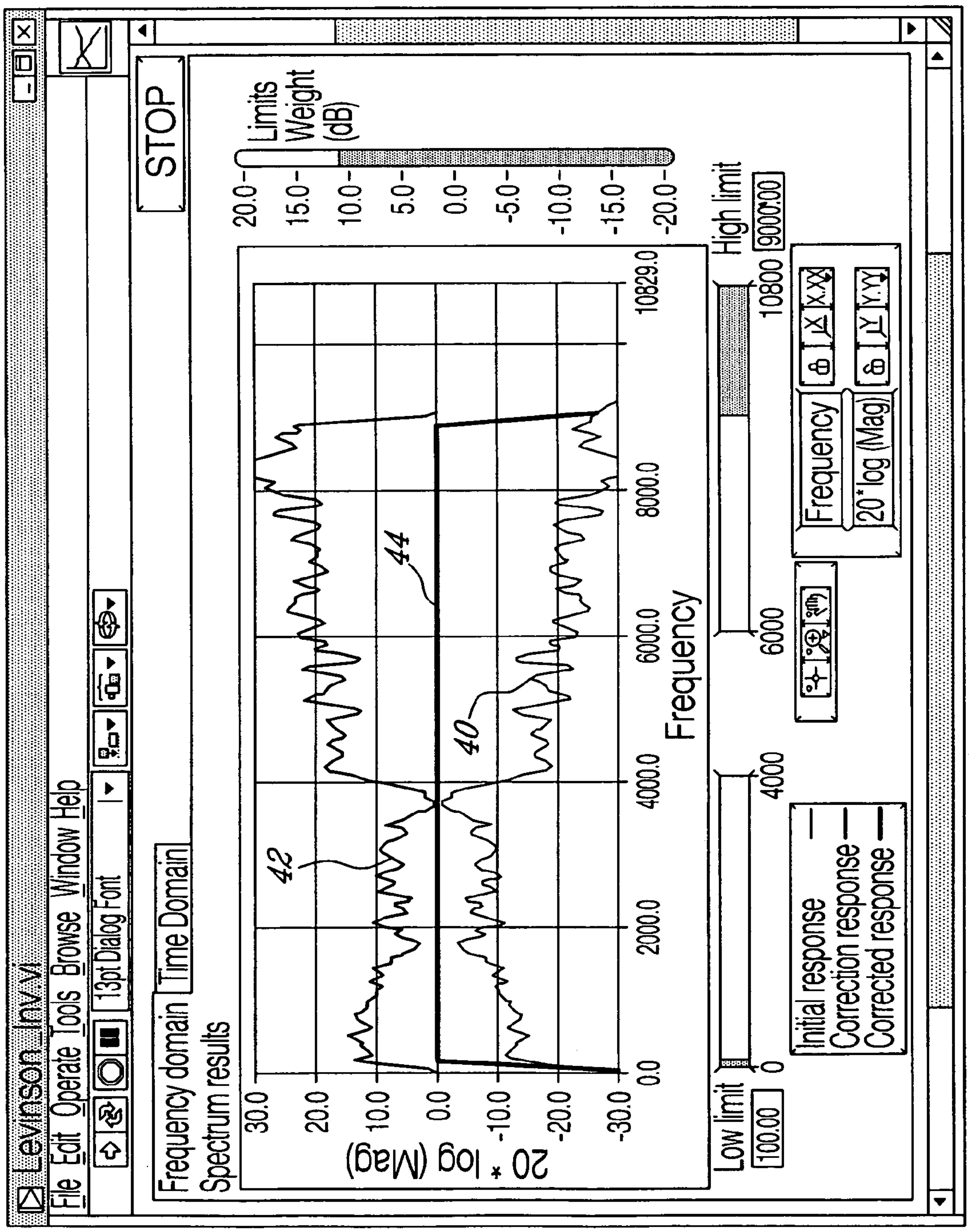
FIG. 3 illustrates a correction filter of the acoustical response of the room determined in the step of FIG. 2.

In step 20, a correction filter (line 42 FIG. 3) to be applied to the measured acoustical response (line 40 FIG. 3) of the room in order to yield a flat frequency response (line 44 FIG. 3) in an emission frequency band of the target masking noise is determined, thereby allowing overcoming this acoustical response of the room.

Figure 2:
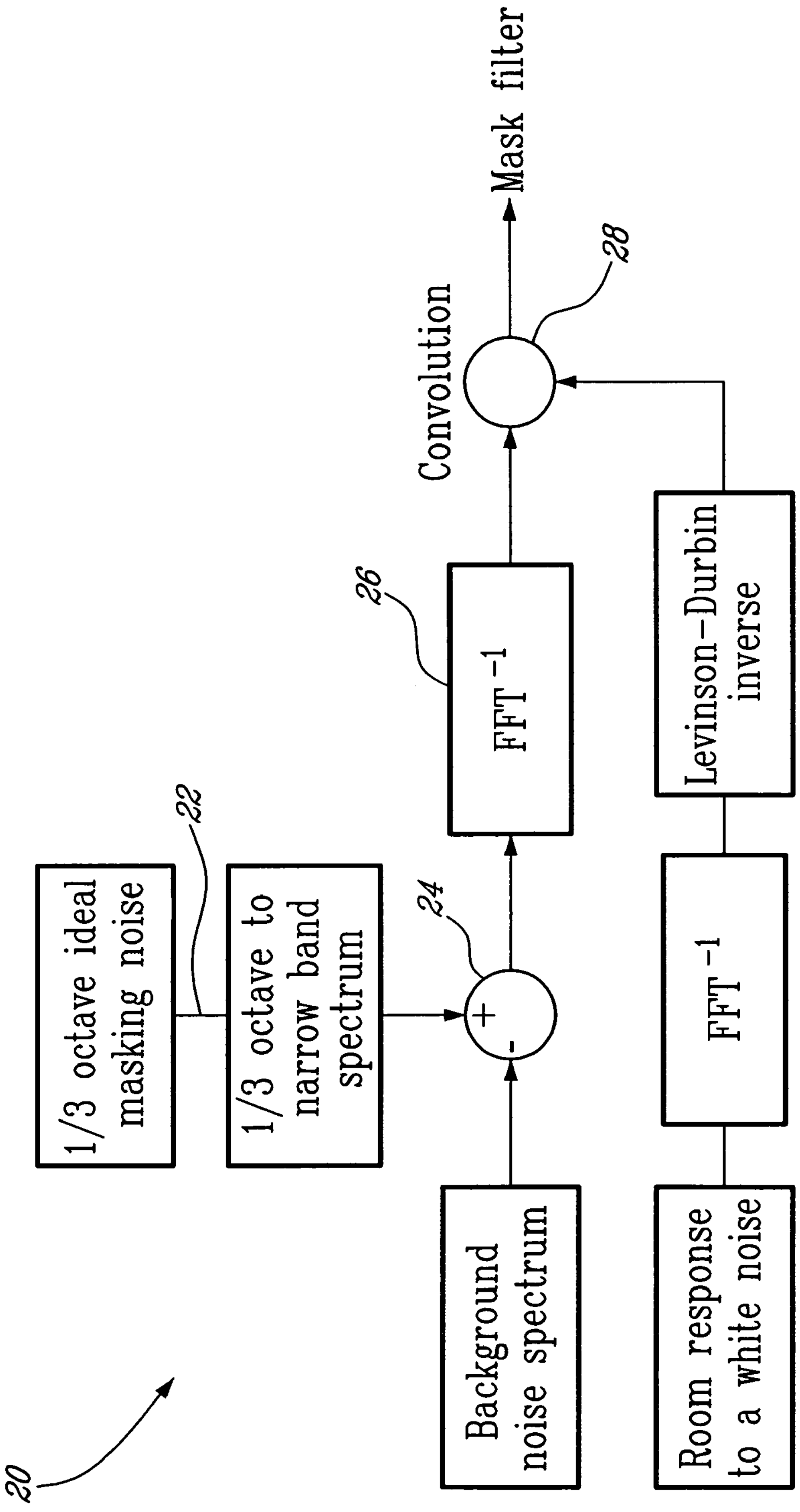
FIG. 2 is a flowchart of step 20 of the method of FIG. 1.
Figure 4:
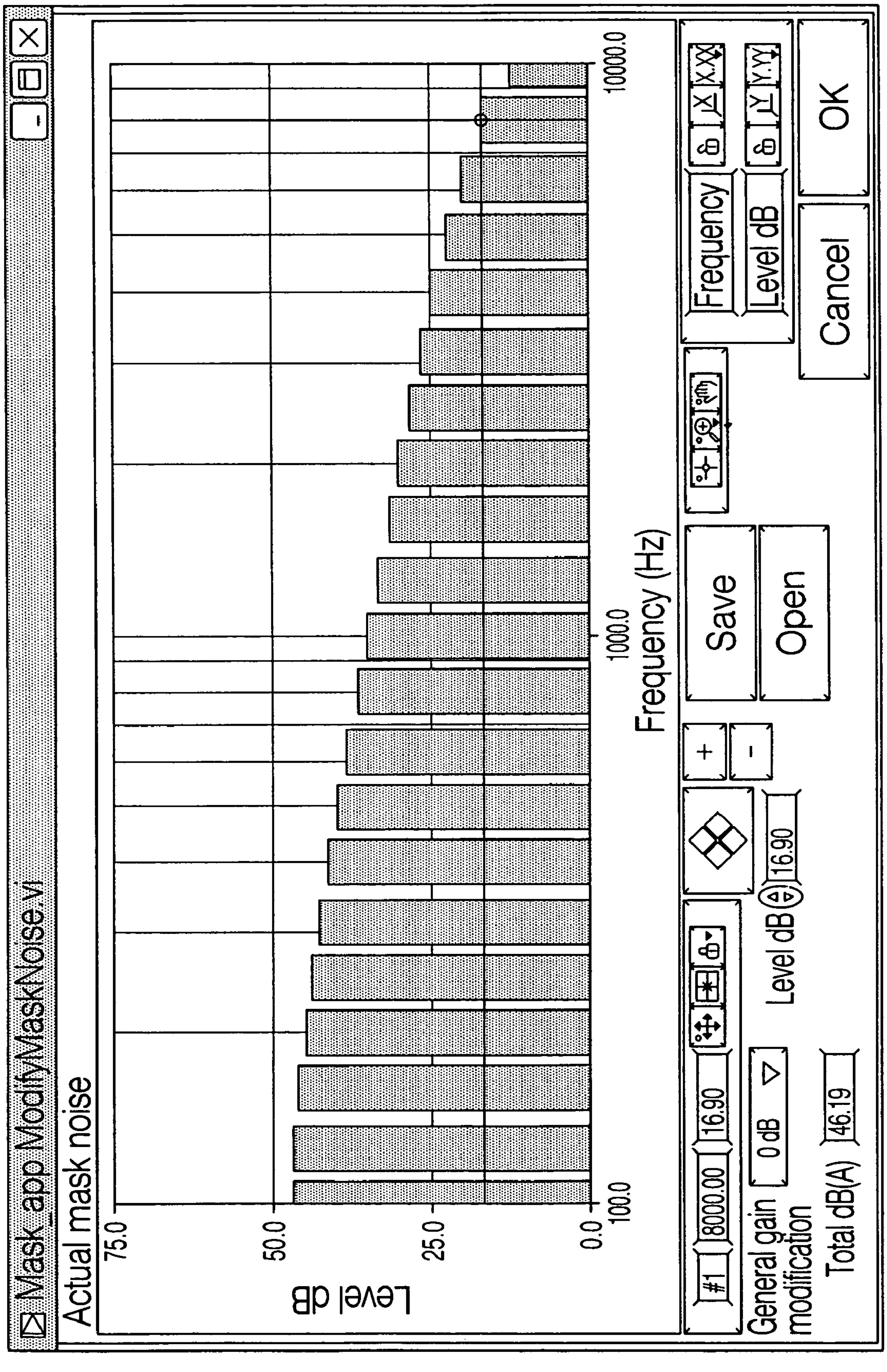
FIG. 4 is a display of an ideal masking noise defined in ⅓ octave.

More precisely, as shown in FIG. 2, the target noise, which is in this case an ideal masking noise defined by values at ⅓ octave (see FIG. 4), is transformed into a narrow band spectrum (step 22). The ambient noise is then subtracted frequency by frequency therefrom (step 24) to yield a corrected masking spectrum, which is in turn transformed by reverse FFT (step 26) into a time filter. This time filter is then convoluted (step 28) with a correction time filter obtained from the room acoustical response, processed by a reversed FFT and a reverse Levinson-Durbin transform, thereby yielding a mask filter.

It is to be noted that the method allows achieving the target masking noise as selected in advance. It may be desired to use as the target noise the so-called ideal masking noise as known in the art. It may be contemplated that the method provides a target masking noise set, by default, as this ideal masking noise. However, it may be desired to use a modified masking noise spectrum as the target masking noise spectrum (see for example FIGS. 8-10).

Figure 5:
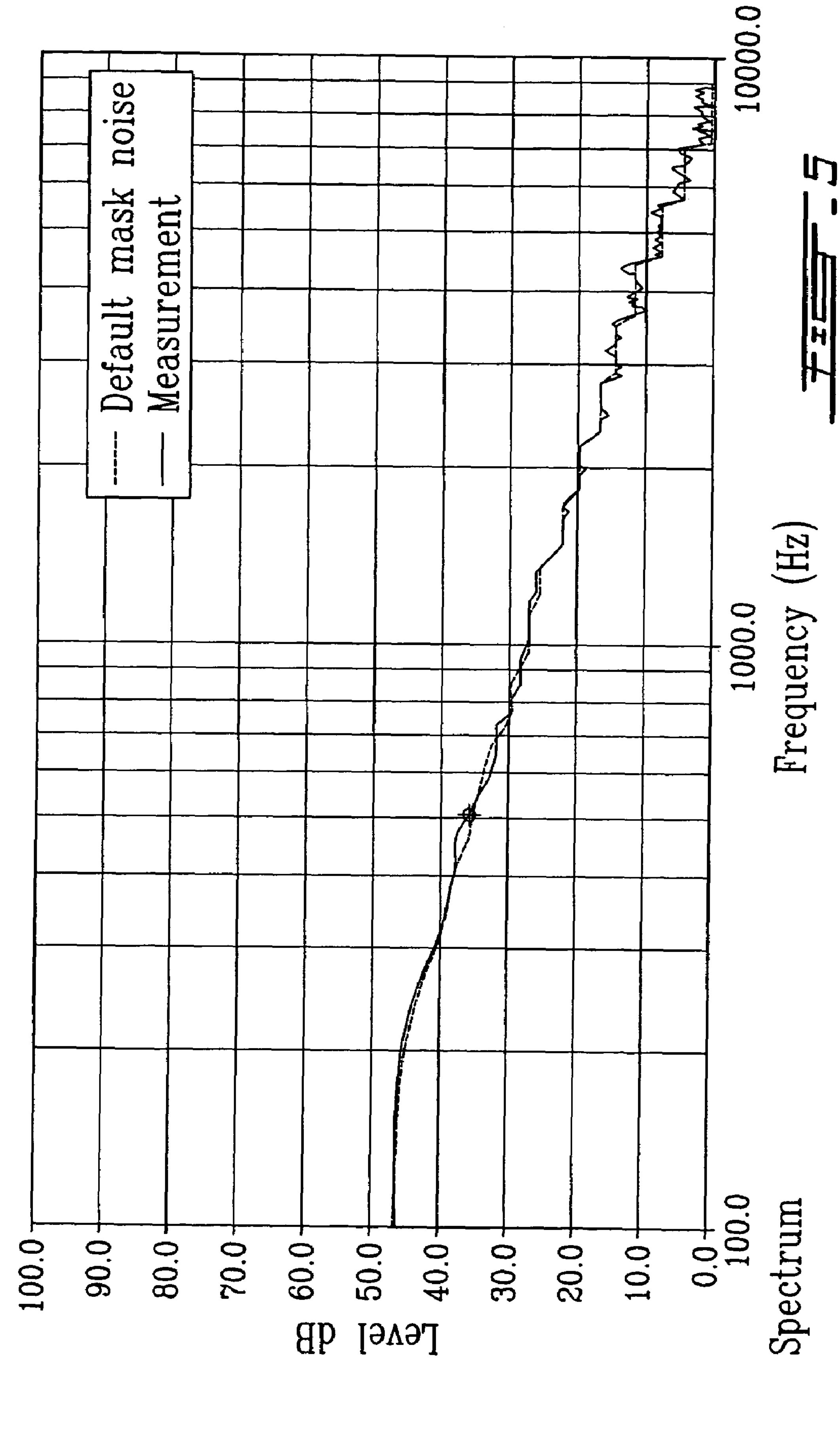
FIG. 5 is a display of a measure during a step of testing a mask filter in step 30 of FIG. 1.

In step 30, a masking noise emitted as an output of the mask filter obtained in step 20 in the room is measured by microphones. FIG. 5 illustrates a result of a test of the auto-adjustment of the masking noise emitted through the mask filter by comparing an averaged spectrum of a signal issuing therefrom with the target masking noise.

Figure 6:
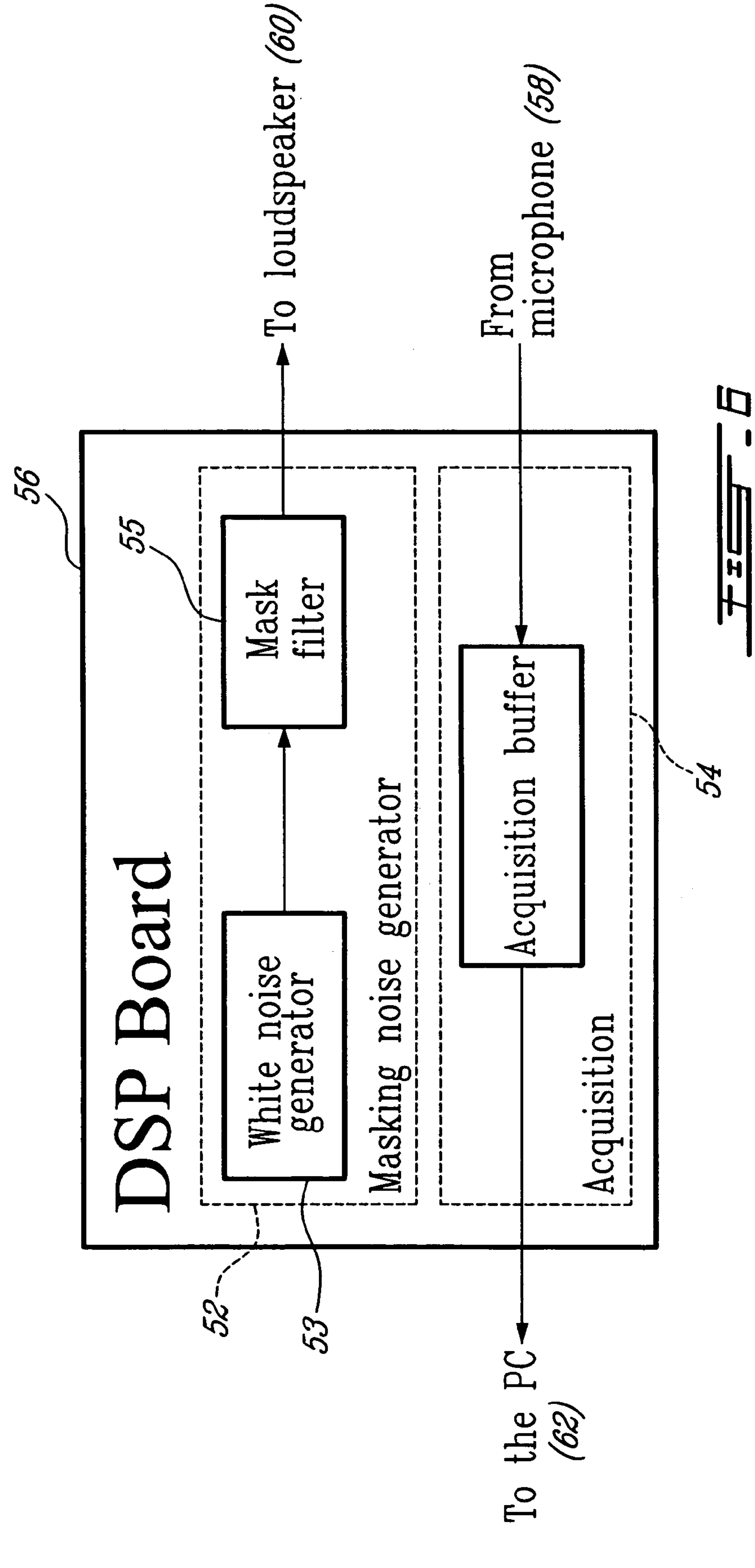
FIG. 6 is a schematic view of a noise generator of a system according to an embodiment of a second aspect of the present invention.

As illustrated in FIG. 6 of the appended drawings, a masking noise generator 52 according to an embodiment of a second aspect of the invention generally comprises a white noise generator 53 and a mask filter 55.

The white noise generator 53 is based on a LCG technique (Linear Congruencial Generator) for example, which is known to allow a very long period for the random sequence and a fast implementation on a digital signal processor.

The masking noise generator 52 and an acquisition unit 54 connected to a drive unit 62 are embedded in a digital sound field processor board (DSP) 56. The drive unit 62 may be a PC for example.

Figure 7:
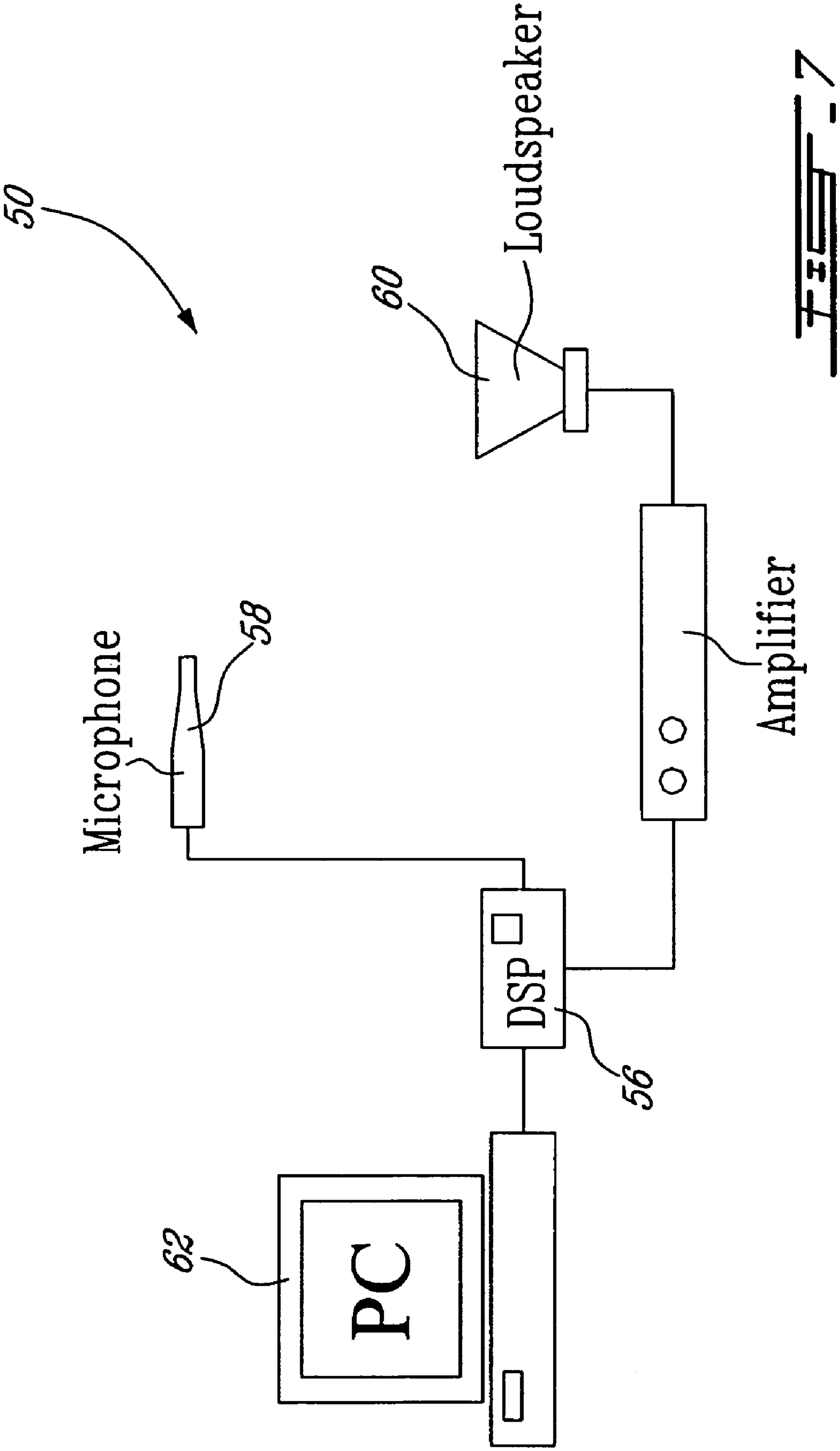
FIG. 7 is a general set-up of the system according to an embodiment of a second aspect of the present invention.

For measuring the acoustical response of the room to be monitored, loudspeakers 60 are located at their final location in the room to be monitored. They may be, for example, located in a suspended ceiling of the room, in such a position that they emit towards the ceiling as is well known in the art. Alternatively, in absence of a suspended ceiling for example, they may be integrated into a structure of the room and emit downwards or upwards. As illustrated in FIG. 7, they are made to emit a white noise emitted by the white noise generator 53 from an amplified output of the DSP 56, wherein the generated white noise is constant in frequency on the emission range of a target masking noise, and is much louder than an usual masking noise so as to be well above the ambient noise of the room, so that this ambient noise may be neglected during measurement. Microphones 58, connected to an input of the DSP board 56, then collect a noise to be masked in the room, which includes a contribution of the loudspeakers 60, and send it to the acquisition unit 54 and the drive unit 62 for computation of an average thereof.

For measuring the ambient noise, the microphones 58 are activated without emission of the loudspeakers 60, and the drive unit 62 computes an average of a spectrum of the signal coming from the microphones 58.

One the mask filter 55 is determined according to the preselected target masking noise (see description above) the system is ready to emit the target masking noise.

Figure 8:
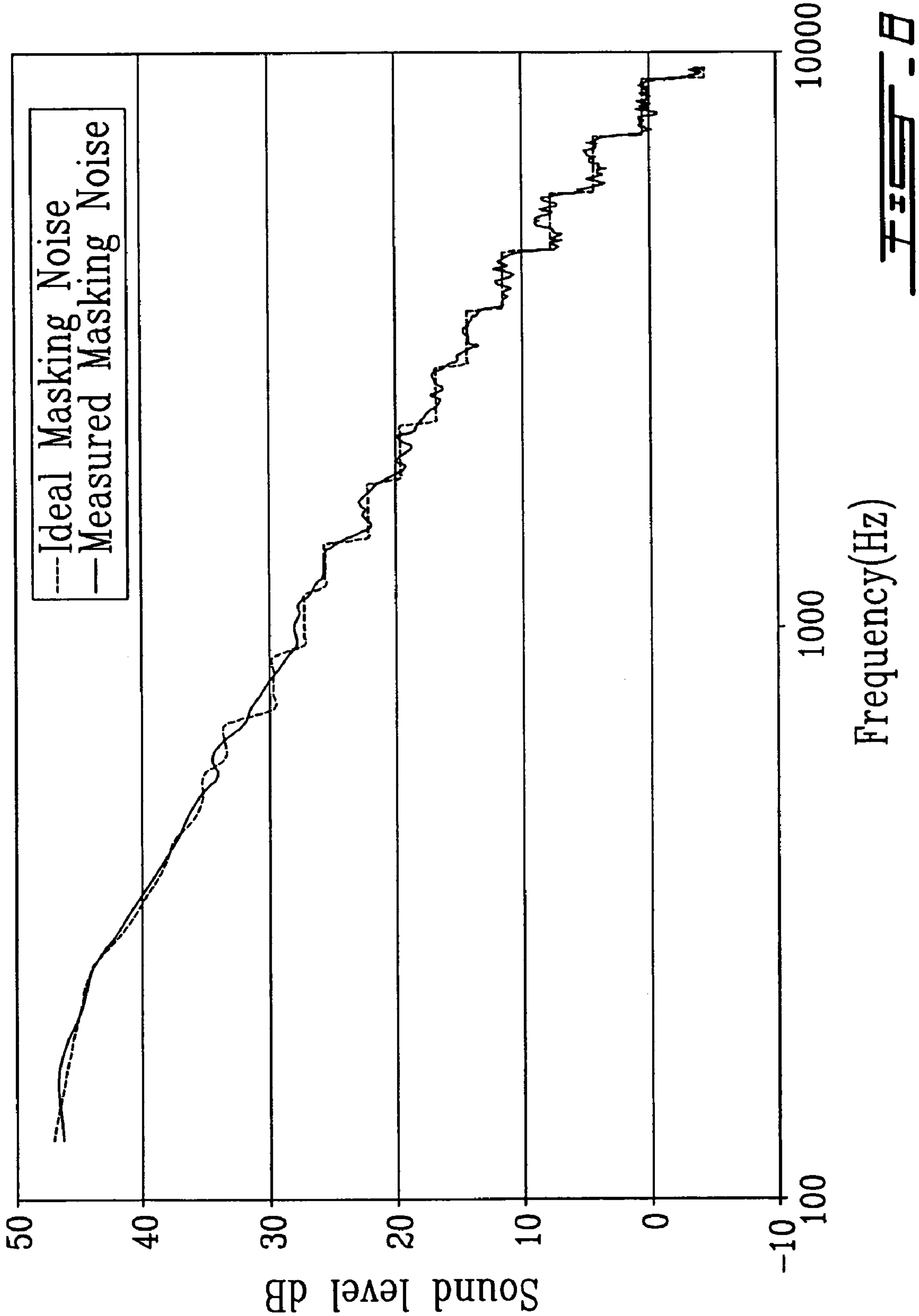
FIG. 8 is a graph comparing the target noise and a measured masking noise (narrow band spectrum)
Figure 9:
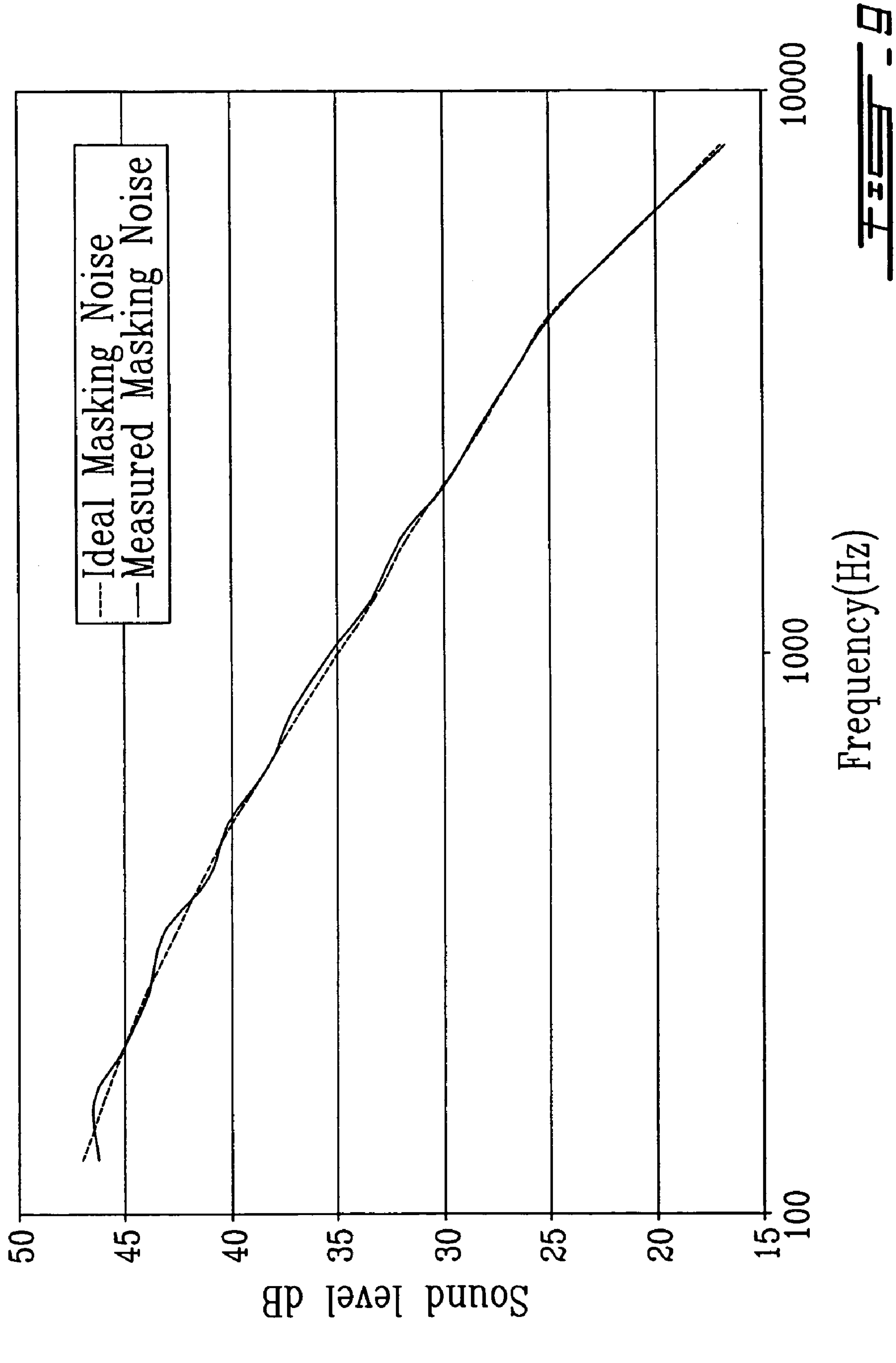
FIG. 9 is a graph comparing the target noise and a measured masking noise (⅓ octave spectrum)
Figure 10:
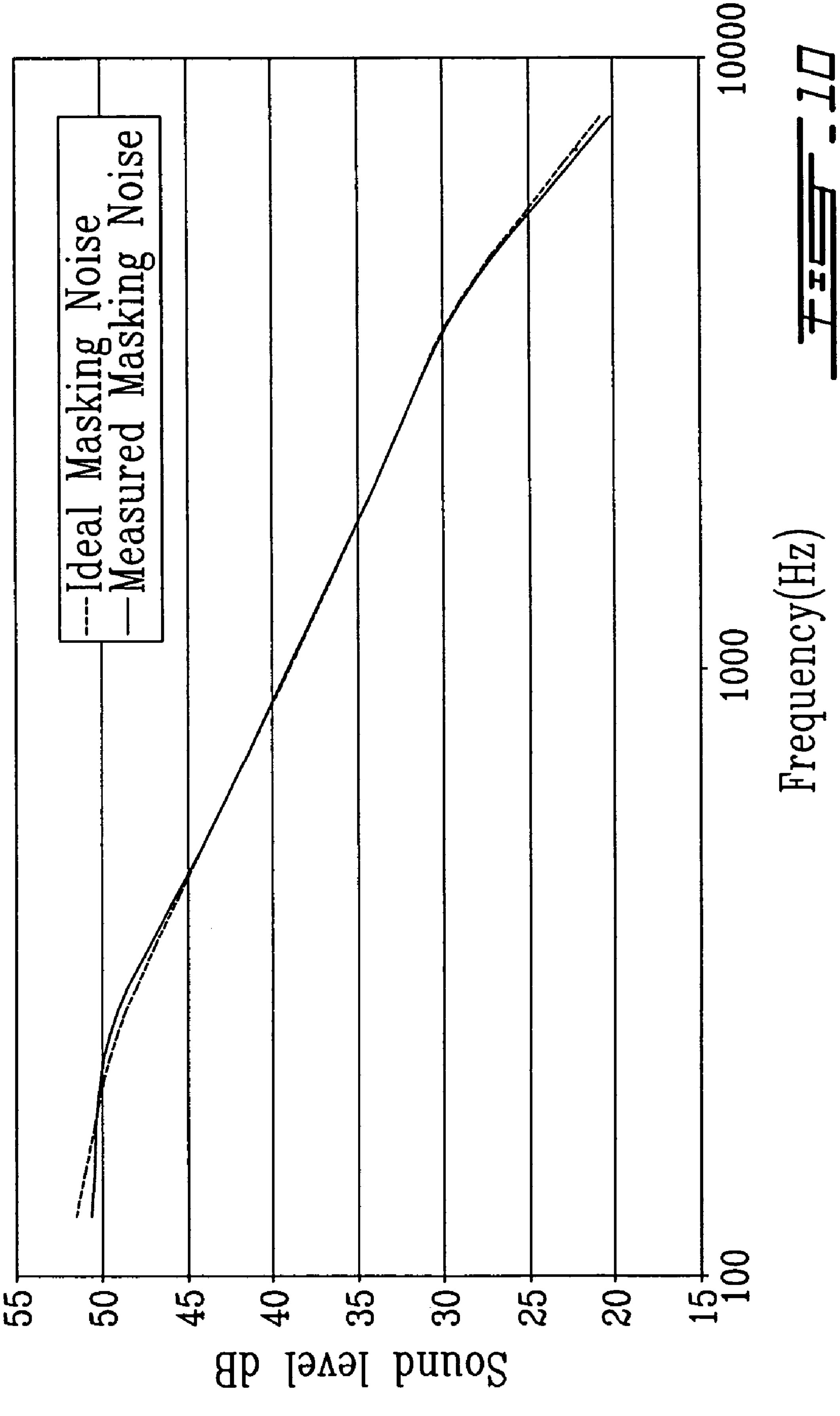
FIG. 10 is a graph comparing the target noise and a measured masking noise (octave spectrum).

It is possible to check the adjustment of the mask filter 55 by using the microphones for measuring the masking noise effectively emitted in the room through the mask filter 55, and by comparing the measured masking noise (fill line) with the target masking noise (dotted line), as illustrated in the graphs of FIGS. 8-10.

The system of the present invention allows taking into account the ambient noise, providing that the ambient noise is lower than the target masking noise. Ambient noise may include for example noise of ventilation systems, which may have levels equal and even higher than levels of the masking system in some frequency bands.

Moreover, the system of the present invention allows taking into account, for each room to be monitored, any acoustical coupling occurring between different zones of the building hosting the room, by generating the masking noise in the building in its entirety except from the room where the ambient noise is being measured. Therefore, the measured ambient noise includes the acoustical coupling with neighboring zones.

Interestingly, the DSP board processor comprises a single filter, which is auto-adjusted to take into account the frequency features of the room, the ambient noise and the target masking noise by including the correction of the acoustical response of the room and the spectrum of the target masking noise corrected by the ambient noise, in a step prior to emission of the target masking noise.

It is to be noted that according to the present invention, the contribution to the acoustical response of the room due to the loudspeakers is taken into account whatever the location of the loudspeakers in the room.

The system and method of the present invention allow generating a masking noise level and spectrum automatically adjusted to obtain a target masking noise spectrum in a room.

Although the present invention has been described hereinabove by way of embodiments thereof, it may be modified, without departing from the nature and teachings of the subject invention as defined in the appended claims.

All of the compositions and methods disclosed and claimed herein can be made and executed without undue experimentation in light of the present disclosure. While the compositions and methods of this invention have been described in terms of preferred embodiments, it will be apparent to those of skill in the art that variations may be applied to the compositions and methods and in the steps or in the sequence of steps of the method described herein without departing from the concept, spirit and scope of the invention. More specifically, it will be apparent that certain agents that are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference.

U.S. Pat. No. 4,438,526 Acoustical Design of Conventional Open Plan Offices, Institute for research I Construction, National Research Council, Canadian Acoustic, 27(3):23, 2003.

What is claimed is:

1. A sound masking system for emitting a target masking noise in a room, comprising a mask filter that is automatically determined by measuring an acoustical response of the room and an ambient noise in the room, the acoustical response of the room being obtained during emission of an unfiltered white noise in the room and the ambient noise in the room being obtained in the absence of the emission of the unfiltered white noise in the room, and subtracting the ambient noise from an ideal masking noise and correcting by the acoustical response of the room, said mask filter, once determined, filtrating a white noise to yield the target masking noise to be emitted in the room.

2. The sound masking system according to claim 1, further comprising an acquisition unit, microphones collecting signals representing the acoustical response of the room during emission of the unfiltered white noise in the room and sending the signals to said acquisition unit to determine the acoustical response of the room; and said microphones collecting signals in the room in the absence of the emission in the room, and sending them to said acquisition unit to determine the ambient noise.

3. The sound masking system according to claim 1, said system being embedded in a digital sound field processor board (DSP).

4. The sound masking system according to claim 1, said system being connected to a drive unit.

5. The system of claim 1, further comprising at least one loudspeaker for emitting the unfiltered white noise and for emitting the filtered white noise.

6. The sound masking system according to claim 5, wherein the acoustical response of the room comprises a contribution due to the at least one loudspeakers whatever a location of the at least one loudspeakers in the room, and the ambient noise includes an acoustical coupling with neighboring zones of the room.

7. A method for generating a target masking noise in a room, comprising:

obtaining an acoustical response of the room during emission of an unfiltered white noise in the room;

obtaining an ambient noise in the room in the absence of the emission of the unfiltered white noise in the room;

determining a noise correction filter by subtracting the ambient noise from an ideal masking noise and correcting the result by the acoustical response of the room;

8. The method according to claim 7, wherein said obtaining the ambient noise comprises obtaining an acoustical coupling with neighboring zones of the room.

9. The sound masking system according to claim 8, wherein the white noise generated by said white noise generator and emitted by the loudspeakers is higher that the ambient noise.

10. The method according to claim 7, wherein said obtaining an acoustical response of the room comprises locating loudspeakers at a final location thereof in the room; emitting a white noise generated by the white noise generator through the loudspeakers; and measuring a resulting noise in the room by microphones; and said obtaining the ambient noise comprises measuring a noise in the room by microphones without emission of the loudspeakers.

11. The method according to claim 10, wherein said obtaining the acoustical response of the room comprises obtaining a contribution due to the loudspeakers whatever a location of the loudspeakers in the room.

12. The method according to claim 7, wherein said step of determining a noise correction filter comprises:

subtracting the ambient noise frequency by frequency from the ideal masking noise to yield a corrected masking spectrum; and convoluting, in a time domain, the corrected masking spectrum with a spectrum of the acoustical response of the room.

13. The method according to claim 7, further comprising testing the noise correction filter by measuring the noise emitted in the room through the noise correction filter, and by comparing the measured noise emitted in the room with the target masking noise.

14. The method according to claim 7, wherein said obtaining an acoustical response of the room comprises emitting a white noise higher that the ambient noise.

15. The method according to claim 7, wherein said obtaining the ambient noise in the room including an acoustical coupling with neighboring zones of the room.

* * * * *

UNITED STATES PATENT AND TRADEMARK OFFICE

CERTIFICATE OF CORRECTION

PATENT NO. : 7,460,675 B2 Page 1 of 1
APPLICATION NO. : 10/873831
DATED : December 2, 2008
INVENTOR(S) : André L'Espérance et al.

It is certified that error appears in the above-identified patent and that said Letters Patent is hereby corrected as shown below:

In claim 7, column 5, line 40, insert --and emitting white noise generated by a white noise generator and filtered by the noise correction filter.--.

Signed and Sealed this

Twenty-fourth Day of February, 2009

JOHN DOLL
*Acting Director of the United States Patent and Trademark Office*